United States Patent [19]
Nakao

[11] Patent Number: 5,994,001
[45] Date of Patent: Nov. 30, 1999

[54] PHASE SHIFT MASK AND ITS MANUFACTURING METHOD AND SEMICONDUCTOR DEVICE AND ITS MANUFACTURING METHOD USING THE PHASE SHIFT MASK

[75] Inventor: Shuji Nakao, Tokyo, Japan

[73] Assignee: Mitsubishi Denki Kabushiki Kaisha, Tokyo, Japan

[21] Appl. No.: 08/824,551

[22] Filed: Mar. 25, 1997

[30] Foreign Application Priority Data

Sep. 2, 1996 [JP] Japan ..................................... 8-232046

[51] Int. Cl.⁶ ........................................................ G03F 9/00
[52] U.S. Cl. ................................................. 430/5; 430/323
[58] Field of Search ................................. 430/5, 322, 324, 430/323, 394; 216/74

[56] References Cited

U.S. PATENT DOCUMENTS 5,672,450  9/1997  Rolfson ........................................ 430/5

FOREIGN PATENT DOCUMENTS 4-301846  3/1991  Japan .
6-51491   2/1994  Japan .

OTHER PUBLICATIONS

Kim, Sung–Gi, et al, "Application of alternating phase shift mask to device fabrication," Proceeding of SPIE, vol. 2440, pp. 515–523, Feb. 1995.

*Primary Examiner*—S. Rosasco
*Attorney, Agent, or Firm*—McDermott, Will & Emery

[57] ABSTRACT

In order to manufacture a phase shift mask for producing a dark line pattern for semiconductor manufacturing, an opaque thin film pattern for forming a dark line is formed at a part of the boundary domain between a phase shift domain and a non-phase shift domain of a quartz substrate. Further, at a boundary portion of the phase shit domain where no opaque thin film pattern is formed, a transition portion is formed in which the etching depth stepwise chances up to $2^n$ different depths by applying etching n times to the portion by different etching patterns at different etching depths. A phase shift mask for producing an open fine line in semiconductor manufacturing is efficiently manufactured with fewer etching steps.

14 Claims, 20 Drawing Sheets

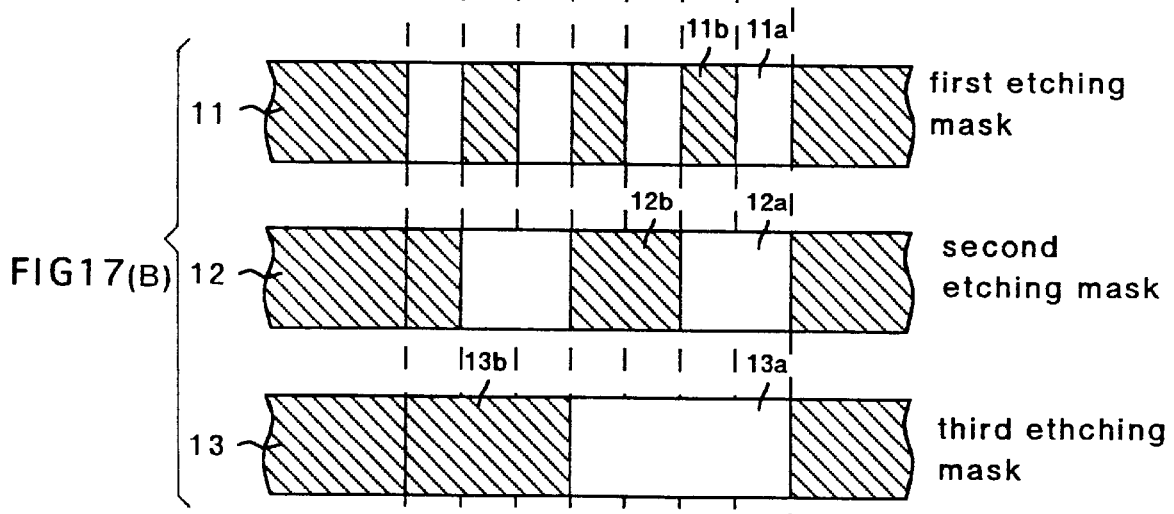
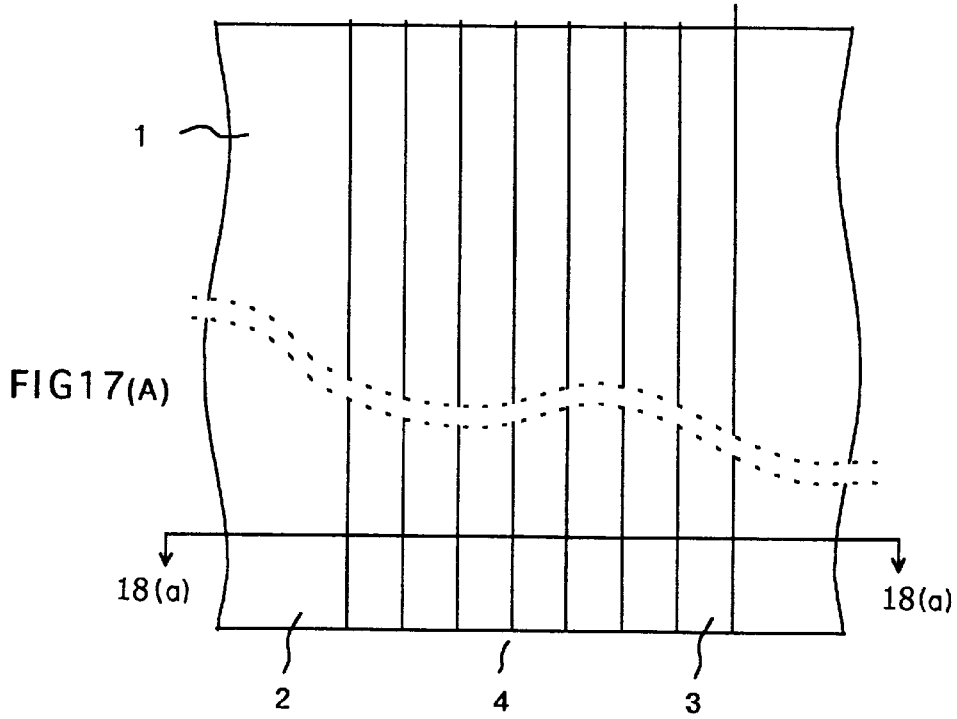

FIG18(A)
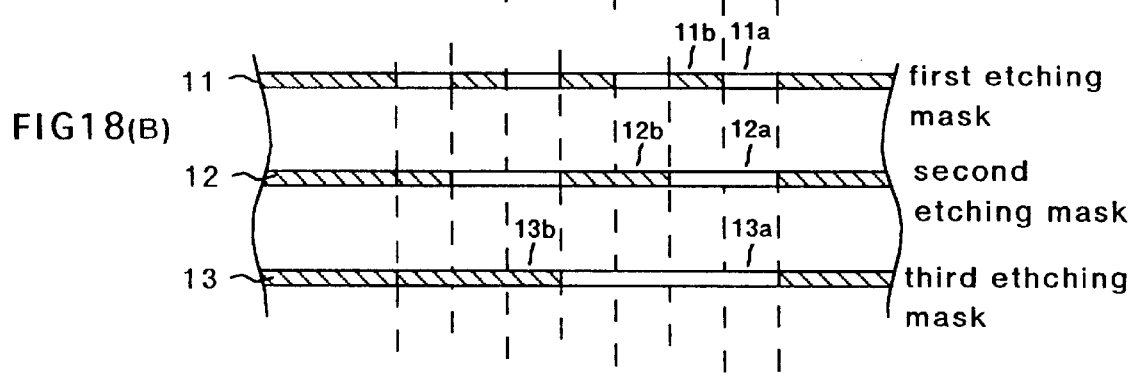
FIG18(B)
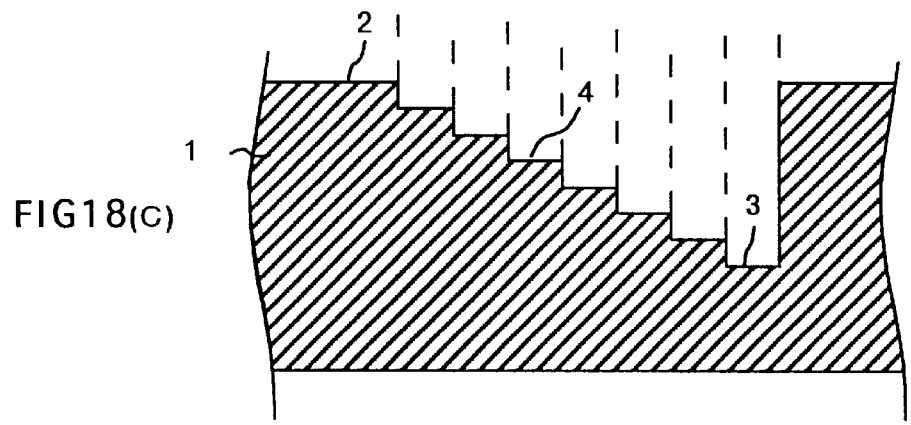
FIG18(C)

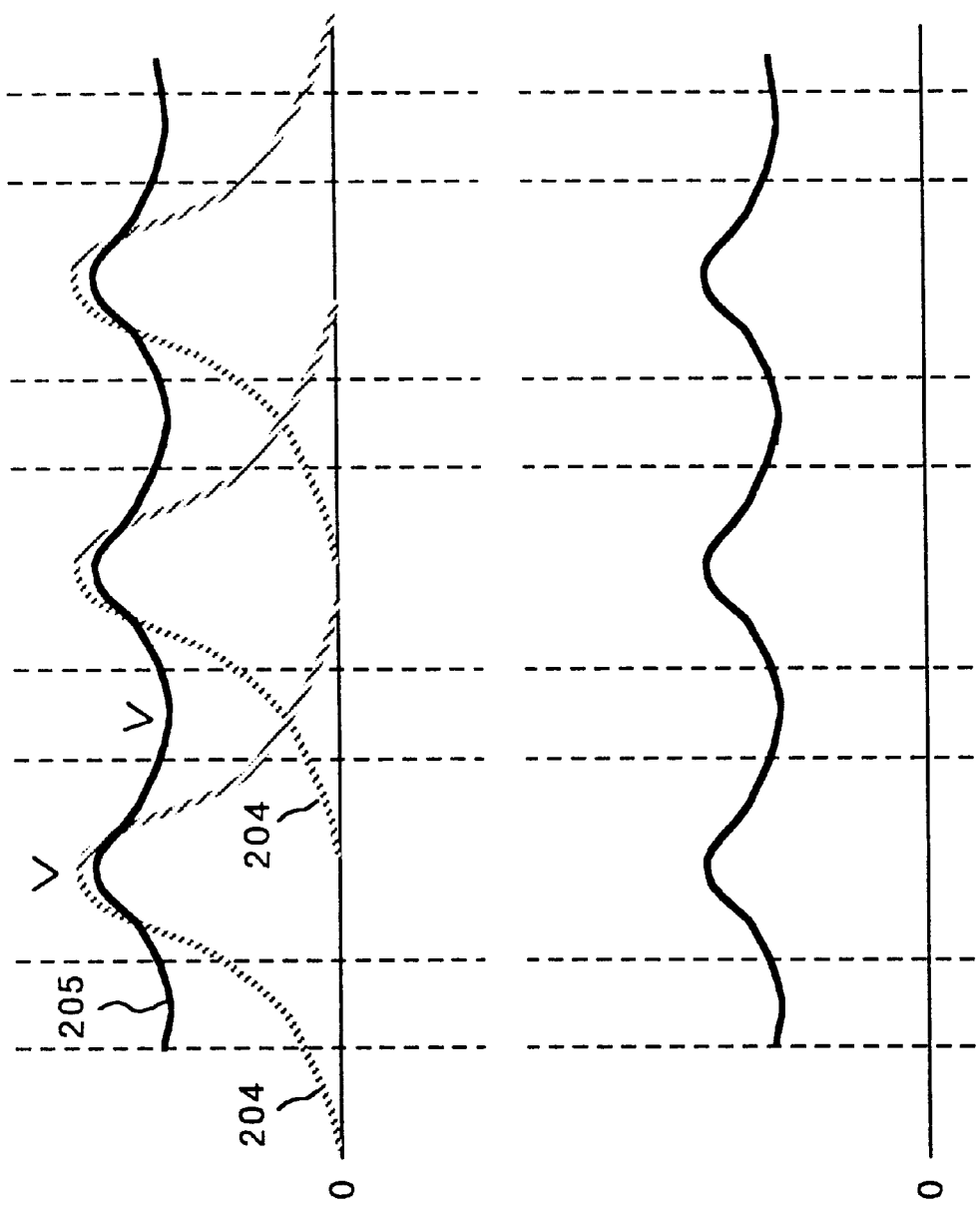

PHASE SHIFT MASK AND ITS MANUFACTURING METHOD AND SEMICONDUCTOR DEVICE AND ITS MANUFACTURING METHOD USING THE PHASE SHIFT MASK

TECHNICAL FILED

The present invention relates to a phase shift mask, a type of photomask, for use in semiconductor manufacturing, and a method of manufacturing the phase shift mask. The present invention further relates to a semiconductor device and a method of manufacturing a semiconductor device using the phase shift mask as an original plate for forming a pattern by optical lithography.

BACKGROUND ART

Semiconductor integrated circuits have been increased in integration density, thereby improving functions and performance. Increased integration density of circuitry has been achieved by reducing pattern size, thereby forming the circuit in a smaller domain. That is, pattern size reduction has supported the semiconductor industry.

Conventionally, a photomask is employed during various photolithographic processing phases during the manufacture of the semiconductor device, serving as an original plate for transferring a fine pattern, as to a semiconductor substrate during formation of an integrated circuit. The photomask pattern is transferred at the original size or at a reduced size. The resolving dimension L of a photolithographic pattern is generally expressed as L=k1 X p /NA, wherein: p denotes an exposure wavelength; NA denotes a numerical aperture of a projective optical system; and k1 denotes a constant for a process having a value of approximately 0.5. Therefore, to form a fine pattern, it is necessary to decrease the exposure wavelength p and increase the numerical aperture NA.

In order to form a finer pattern by photolithography, the exposure wavelength has been decreased and a KrF excimer laser beam with a wavelength of 248 nm has been employed as a light source. It is known, however, that the depth of focus (DOF) for pattern transfer is generally expressed as DOF=k2 xp /NA$^2$. Accordingly, the depth of focus DOF decreases as the exposure wavelength decreases. Therefore, it is possible to improve photolithographic resolution by decreasing the exposure wavelength, thereby further improving DOF.

Photolithographic performance can be improved by using the so-called ultra-resolving technique. Typically, however, deformed illumination and phase shift exposure techniques are used. The exposure technique, using the so-called Levenson phase shift mask, is considered the most promising, because the resolution and DOF can be significantly improved. The Levenson phase shift mask is a photomask for modulating phases of exposed rays passing through adjacent opaque-film apertures, creating opposite phases.

Adverting to FIGS. 19(a) and 19(b), conventional practices comprise modulating projected light employing a conventional photomask. FIG. 19(a) illustrates a sectional view of conventional photomask 200 comprising an opaque-film pattern 201 and an opaque-film aperture pattern 202. FIG. 19(b) shows the electric field amplitude after exposure through photomask 200, modulated by the aperture pattern.

FIGS. 20(a) and 20(b) show the electric field of a projected image on a semiconductor wafer on which a pattern of the photomask in FIG. 19(a) is transferred. FIG. 20(a) shows the electric field amplitude on the wafer, with an electric field 204 according to each aperture and a synthesized electric field 205. FIG. 20(b) shows the electric field intensity on the wafer. When a numerical aperture NA of an imaging system becomes less than 1, the electric field components, which change spatially and finely in the modulation information immediately behind the photomask, are removed. Further, an electric field having a moderate fluctuation is formed. The electric field modulated by adjacent apertures also has a moderate fluctuation. As a result, a synthesized electric field with considerable intensity between adjacent apertures is formed, preventing the two adjacent apertures from being separated.

FIGS. 21(a) and 21(b) illustrate how projected light is modulated by a Levenson phase shift mask. FIG. 21(a) illustrates a sectional view of a Levenson phase shift mask 300, including an opaque-film pattern 301, an opaque film aperture pattern 302 without phase shift processing, and an opaque-film aperture pattern 303 with phase shift processing. FIG. 21(b) shows the electric field amplitude immediately after exposure through Levenson phase shift mask 300. As shown in these drawings, modulation of an electric field by an opaque-film aperture is equivalent to modulation by a conventional mask. However, the electric field modulated by adjacent apertures is reversed in phase by the function of the Levenson phase shift mask.

FIGS. 22(a) and 22(b) illustrate the electric field of a projected image of a Levenson phase shift mask on a semiconductor wafer, on which a transferred pattern is formed by the Levenson phase shift mask shown in FIG. 21(a). FIG. 22(a) shows the electric field amplitude on the wafer, with an electric field 304 and a synthetic electric field 305. The image of each opaque-film aperture formed by an optical system with numerical number NA has a moderate fluctuation which is similar to a conventional mask. However, unlike the conventional mask, phases of adjacent apertures are reversed, offsetting the electric fields between the apertures. Therefore, the images of the adjacent two apertures are separately formed. Thus, high-resolution imaging results.

As shown above, the exposure resolution is improved using a Levenson phase shift mask. However, a normal Levenson phase shift mask has the following problem. When a dark pattern including a fine dark line is formed, the dark pattern is always angularly formed, and cannot be formed as an open line. In other words, the dark pattern can only be formed as a multiply-connected domain, including one or more simply-connected bright domain or domains. This occurs because the Levenson phase shift mask is formed to provide either a 0 p or a 180 p phase shift.

FIGS. 23 to 26 illustrate a conventional Levenson phase shift mask having two kinds of phases with a phase shifter formed by etching a quartz substrate. FIGS. 27 to 29 illustrate the formation of a fine dark line pattern by the above-mentioned Levenson phase shift mask.

FIG. 23 is a perspective view of a conventional phase shift mask 400, and FIG. 24 is a top view of the phase shift mask 400. FIG. 25 is a sectional view of the phase shift mask taken along line A—A in FIG. 24. FIG. 26 is a sectional view of the phase shift mask taken along the line B—B in FIG. 24.

As shown in FIGS. 23 to 26, in forming a fine dark line pattern, the opaque-film pattern 405 on quartz substrate 401 is sandwiched by opaque-film aperture patterns 402 and 403. In this case, unless the dark line connects two points on a boundary specifying the whole domain for a mask formation (i.e., unless the dark line is connecting opposite ends of a mask), at least one of the two opaque-film aperture patterns 402 and 403 is closed. In FIGS. 23 to 26, opaque-film aperture portion 403, with shifter processing, is formed as a closed pattern. Opaque-film aperture portion 402, without shifter processing, is formed to surround opaque-film aperture portion 403. Opaque-film pattern 405, corresponding to a required dark line, is formed between opaque-film aperture patterns 402 and 403.

FIGS. 27(a) and 27(b), and FIGS. 28(a) and 28(b), illustrate transmission of light applied vertically to the phase shift mask. FIG. 27(a) shows a cross section of opaque-film 405 for forming a dark line of the phase shift mask. The intensity of light passing through the cross section causes a dark line portion due to opaque-film 405, as shown in FIG. 27(b). FIG. 28(a) shows the cross section of a boundary portion of the phase shift domain of the phase shift mask. The intensity of the light passing through the cross section causes a dark line portion as shown in FIG. 28(b).

FIG. 29 shows a resist pattern formed on the positive resist on a wafer by the phase shift mask 400. A dark line image is formed on a portion corresponding to the opaque-film pattern 405, and resist pattern 406 is formed, since the positive resist is not dissolved due to development. Resist pattern 406 is formed as required, however, a dark line image is also formed at the boundary portion between opaque-film aperture patterns 402 and 403. The opaque-film pattern 405 is not present. This results because phases of the transmitted rays are reversed from each other on both sides of the boundary. Thus, a resist pattern 407 is formed on the wafer. That is, an open linear pattern is not formed but, a closed pattern including unnecessary pattern 407 is formed.

Therefore, to form a line pattern including an open line, a negative resist whose resolution is generally inferior to that of a positive resist must be used. Accordingly, adequate resolution cannot be obtained.

A method for addressing the problem in the conventional technique has been proposed in which the phase difference of the transmitted light in opaque-film apertures on both sides of a linear opaque-film pattern is 180 p. This is accomplished by changing the phase of transmitted light continuously between the apertures and, as a result, the entire domain surrounding the linear opaque-film pattern becomes a bright domain. An example of such a method is described in "Proc. SPIE 2440, p. 515", wherein portions having phase difference of 5gradations, i.e., 0 p, 45 p, 90, 135 p, and 180 p, are stepwise formed in one opaque-film aperture in order to continuously change the phase of transmitted light. Thus, a dark line image is prevented from occurring due to adjacent 0 p and 180 p portions. In this example, however, resist patterning and etching are performed four times in order to form a practically continuous phase transition portion. In this method, in order to manufacture a mask having n+1 phase gradations, resist patterning and etching must be performed n times respectively. Therefore, since many more patterning and etching steps are required, the production cost is increased, and the yield lowered.

DISCLOSURE OF THE INVENTION

The present invention addresses and solves the above-mentioned problems attendant upon conventional photolithographic practices by providing a multiphase-gradation phase shift mask and a method of manufacturing such a multiphase-gradation phase shift mask in which phases are continuously changed employing fewer resist-patterning and etching steps vis-a-vis the conventional method.

One aspect of the present invention is a method of manufacturing a phase shift mask, which method comprises forming an opaque thin-film pattern at a predetermined portion of the boundary between a phase-shift domain and a non-phase-shift domain. A transition portion is formed at the boundary portion to which the opaque thin-film pattern is not applied. In the transition portion, the etching depth stepwise changes to $2^n$ times by performing n etching steps (n is a certain integer more than 2) at different etching depths using different etching mask patterns.

Another aspect of the present invention is a method of manufacturing a phase shift mask, which method comprises forming an opaque thin-film pattern by patterning an opaque thin film formed on a transparent substrate, and thereafter forming the phase shift domain and the transition portion.

A further aspect of the present invention is a method of manufacturing a phase shift mask, which method comprises forming a phase shift domain and transition portion, and thereafter forming an opaque-film pattern.

Another aspect of the present invention comprises a method of manufacturing a phase shift mask, which method comprises forming an etching mask of an opaque conductive material by exposing an electron beam resist applied thereon to a pattern using an electron beam.

A further aspect of the present invention is a method of manufacturing a phase shift mask, which method comprises wet etching a transparent substrate using an etching mask made of a material which is resistant to the wet etchant.

Yet another aspect of the present invention is a method of manufacturing a phase shift mask, which method comprises forming an etching mask of an amorphous silicon thin film doped with phosphorus or boron by wet etching with a chemical solution containing hydrogen fluoride.

Another aspect of the present invention is a method of manufacturing a phase shift mask, which method comprises forming an etching mask pattern by dry-etching a transparent substrate.

A further aspect of the present invention is a method of manufacturing a phase shift mask, which method comprises etching to a depth at an optional time of etching, in the n times of etching, up to $2^{(m-1)}$ times of the unit depth, wherein m is an integer equal to or less than n.

Another aspect of the present invention is a method of manufacturing a phase shift mask, which method comprises etching to a depth at the mth-time etching, in the n times of etching, which is $2^{(m-1)}$ times the unit depth, wherein m is an integer equal to or less than n.

A further aspect of the present invention is a method of manufacturing a phase shift mask, which method comprises etching at an optional time of etching, in the n times of etching, using a mask pattern comprising a rectangle having a width up to $2^{(m-1)}$ times the unit depth, wherein m is an integer equal to or less than n.

Another aspect of the present invention is a method of manufacturing a phase shift mask, which method comprises etching at the mth-time etching, in the n times of etching, using a mask pattern including a rectangle having a width $2^{(m-1)}$ times the unit width, wherein m is an integer equal to or less than n.

Yet another aspect of the present invention is a method of manufacturing a semiconductor device, which method comprises: forming a phase shift mask comprising a phase-shift domain, a non-phase-shift domain, a stepwise transition domain between the phase-shift domain and the non-phase-shift domain, and an opaque thin-film pattern at a predetermined portion between the phase-shift domain and the non-phase-shift domain; depositing a layer of photoresist material on a semiconductor substrate; and transferring a pattern from the phase shift mask to the photoresist layer by photolithography.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

FIG. 17(a) is a partial top view of a phase shift mask according to the present invention.

FIG. 17(b) is a partial top views of a plurality of etching masks according to the present invention.

FIG. 17(c) illustrates the relation between etching masks and binary numbers.

FIG. 18(a) is a partial sectional view of a phase shift mask taken along the line A—A in FIG. 17(a).

FIG. 18(b) is a partial sectional view of a plurality of etching masks which corresponds to the etching masks in FIG. 17(b).

FIG. 18(c) illustrates the relation between etching masks and binary numbers.

FIG. 20 shows the electric field of a projected image on a semiconductor wafer on which a pattern of the photomask in FIG. 19(a) is transferred.

FIG. 20(a) shows an electric field amplitude on a wafer by a photomask shown in FIG. 19(a).

FIG. 20(b) shows an electric field intensity on a wafer by a photomask shown in FIG. 19(a).

FIG. 21 shows how projected light is modulated by a Levenson phase shift mask.

BEST MODE FOR CARRYING OUT THE INVENTION

The present invention will be described in further detail by way of example with reference to the accompanying drawings.

Embodiment 1

Figure 1:
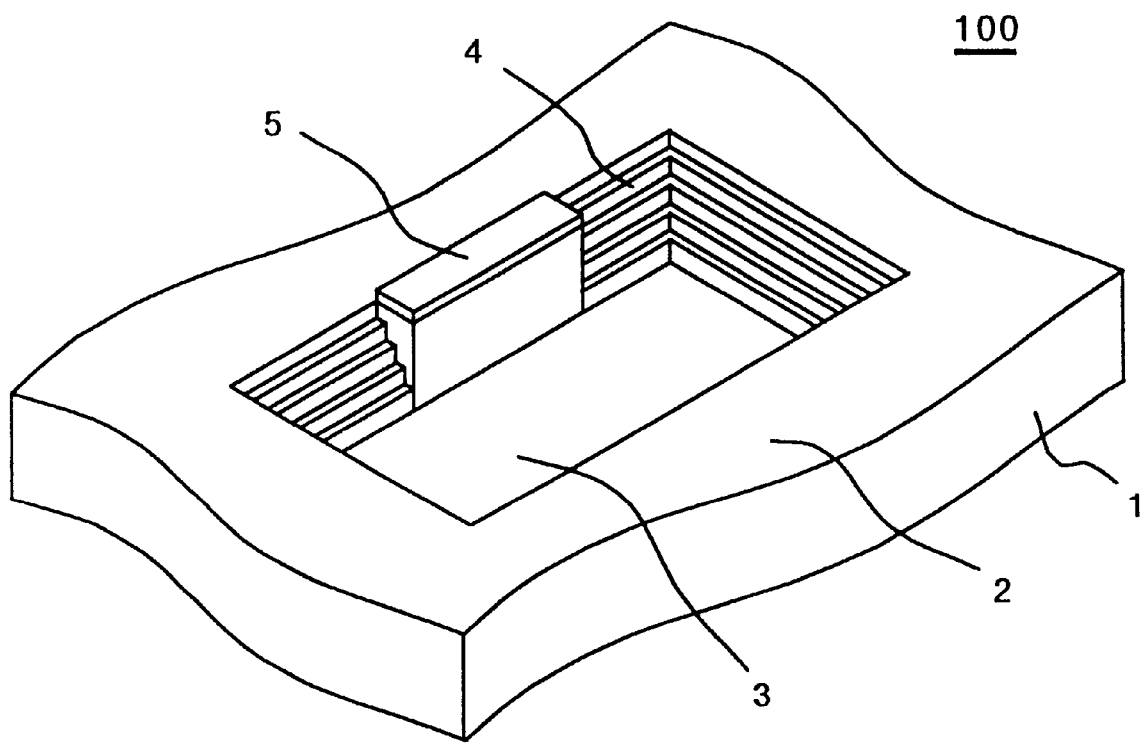
FIG. 1 is a perspective view of a phase shift mask according to the present invention.
Figure 2:
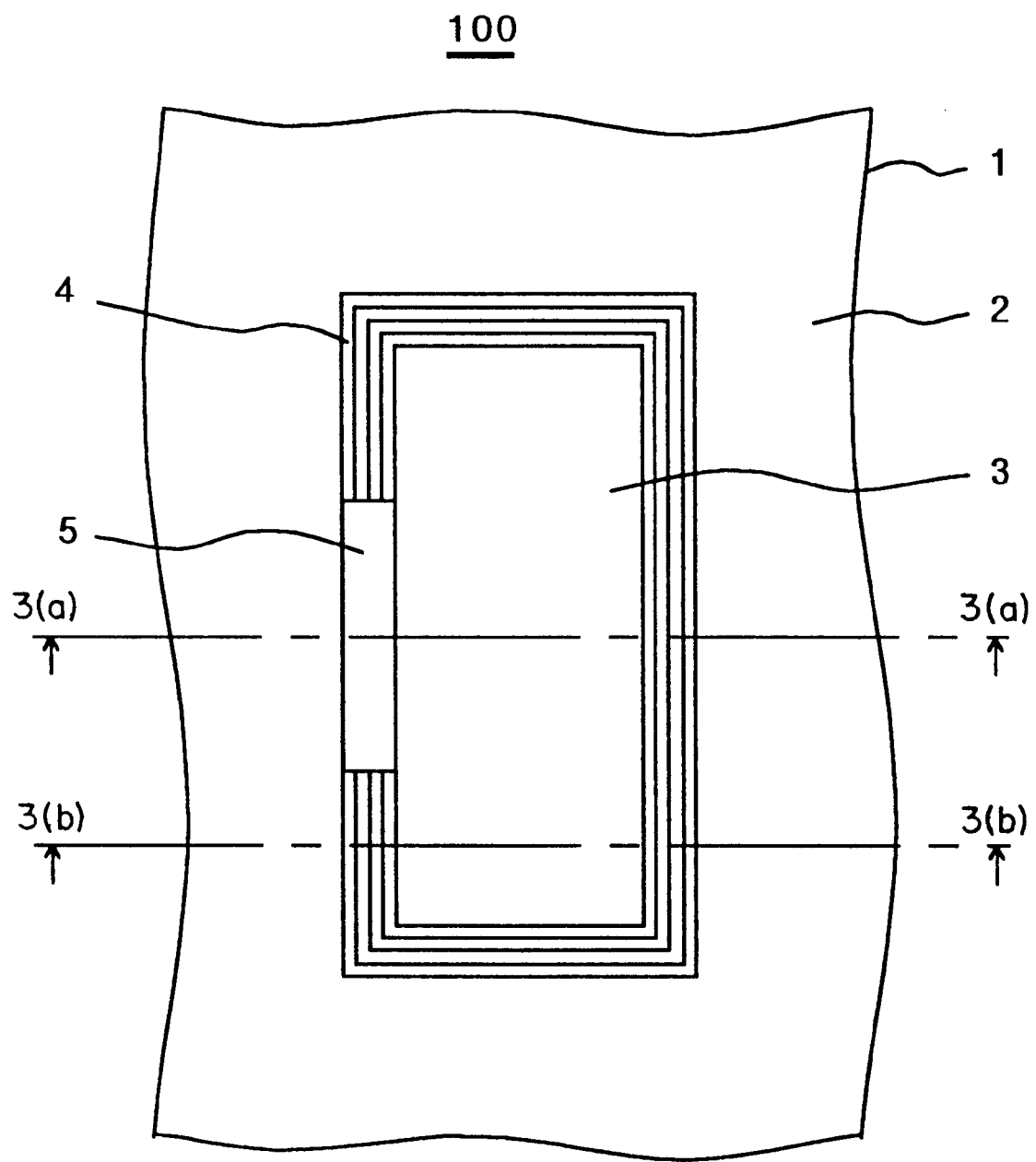
FIG. 2 is a top view of a phase shift mask according to the present invention.
Figure 3A:
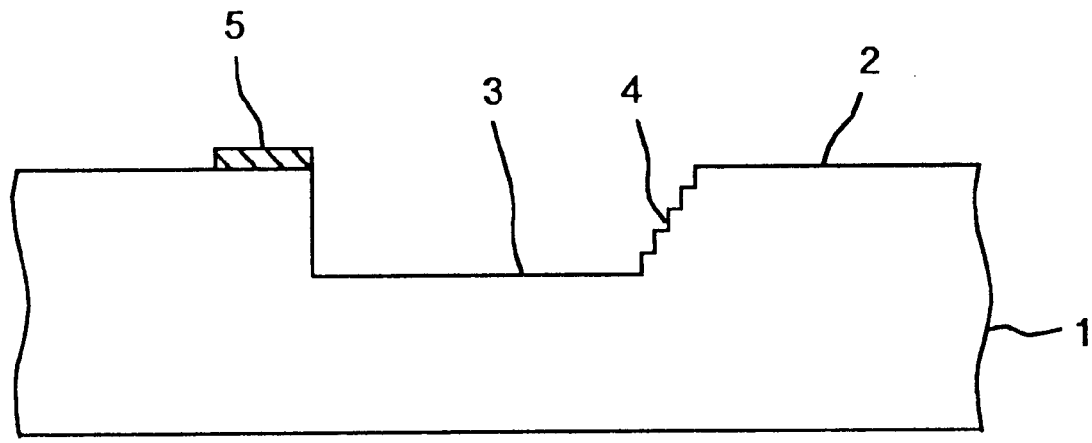
FIG. 3(a) is a sectional view of the phase shift mask taken along the line A—A in FIG. 2.
Figure 3B:
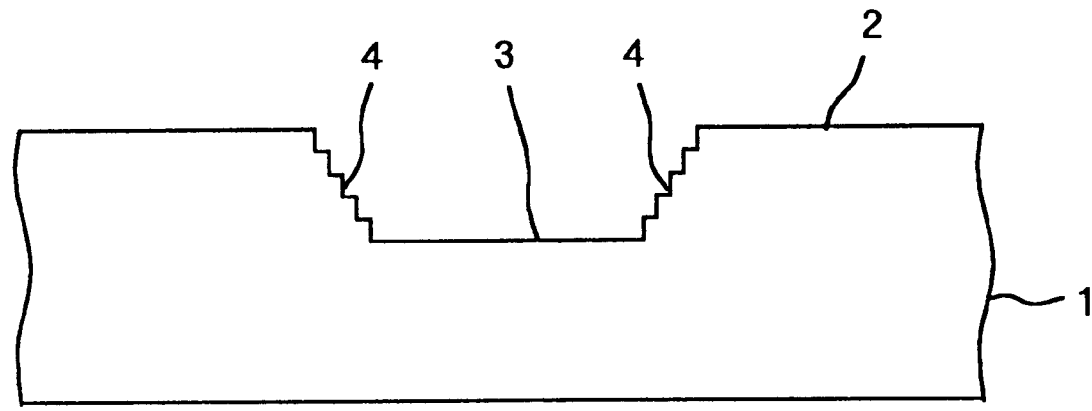
FIG. 3(b) is a sectional view of the phase shift mask taken along the line B—B in FIG. 2.
Figure 5A:
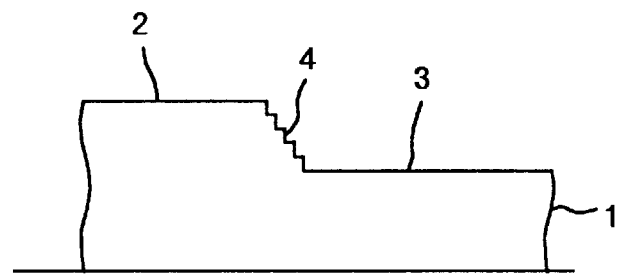
Figure 5B:
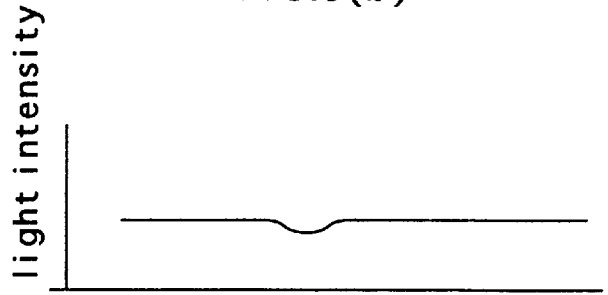
Figure 6:
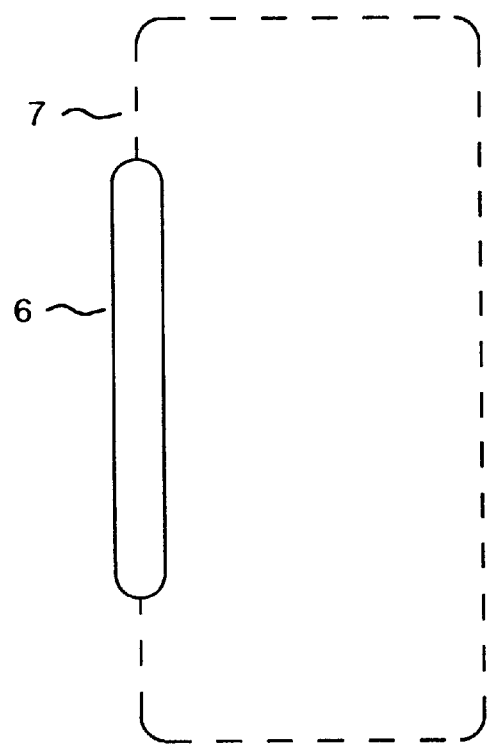
FIG. 6 illustrates a pattern of transmitted light obtained by the phase shift mask.

FIGS. 1 to 6 illustrate a phase shift mask manufactured by the present invention. FIG. 1 is a perspective view of phase shift mask 100 manufactured by the present invention, and FIG. 2 is a top view of phase shift mask 100. FIGS. 3(a) and 3(b) are sectional views of phase shift mask 100. FIG. 3(a) is a sectional view taken along the line A—A in FIG. 2, and FIG. 3(b) is a sectional view taken along the line B—B in FIG. 2. FIGS. 4 and 5 are illustrations for explaining the functions of the phase shift mask, and FIG. 6 is a pattern of transmitted light obtained by the phase shift mask. Further, FIG. 6 is an illustration showing modification of the phase shift mask.

As shown in FIGS. 1 to 3, the inventive phase shift mask comprises quartz plate 1 serving as the substrate of phase shift mask 100. Quartz plate 1 includes a reference plane 2 serving as a reference of phase shifts for vertical transmitting light. The plane 2 is a plane in which no phase shift occurs and comprises an area where an opaque-film opens without being covered with an opaque-film.

A phase shift plane or a phase shift domain 3 is formed as a concave portion so that the transmitting light of this domain causes a phase shift with reference to the transmitted light of reference plane 2. In domain 3, the vertical thickness of substrate 1, that is, the thickness in the transmitting direction of the transmitted light, is decreased. No opaque-film is formed in domain 3, i.e., it is an area where an opaque-film opens. A transition domain 4 is formed between the reference plane 2 and the phase shift plane 3 such that the thickness stepwise changes from the reference plane 2 to the phase shift plane 3. An opaque-film pattern 5 is formed on the boundary between the reference plane (non-phase-shift domain) 2 and the phase shift plane (phase shift domain) 3. Opaque-film pattern 5 is formed of a suitable material, such as a chromium film (Cr). In this embodiment, the opaque-film pattern 5 is a linear pattern for forming a fine dark line.

As described above, opaque-film pattern 5 for forming a dark line is formed such that it is sandwiched between opaque-film aperture patterns 2 and 3, whose transmitted-light phases are opposite to each other. The opaque-film aperture portion 3, to which shifter processing is applied, is formed as a closed pattern. Moreover, the opaque-film aperture portion 2, to which no shifter processing is applied, is formed to enclose the opaque-film aperture portion 3, to which shifter processing is applied. The opaque-film pattern 5, corresponding to a necessary dark line, is formed between opaque-film aperture patterns 2 and 3.

As stated above, the phase shift of the transmitted light between the reference plane 2 and the phase shift plane 3 is formed at an opposite phase of 180. The depth is set to correspond to the wavelength of the transmitting light. For instance, when the i-line (365 nm) is used, phase shift plane 3 is formed up to a depth of approx. 4,325 p.

The opaque mask 5 is formed having a width of approximately 1 mm, forming a dark line at a level of 1 mm or less by this mask. The width of the transition domain 4 between the reference plane 2 and the phase shift plane 3 is set so that transmitted rays at both sides of the domain do not interfere each other. For instance, the width can generally be set to a value almost equal to that of opaque mask 5.

Figure 4A:
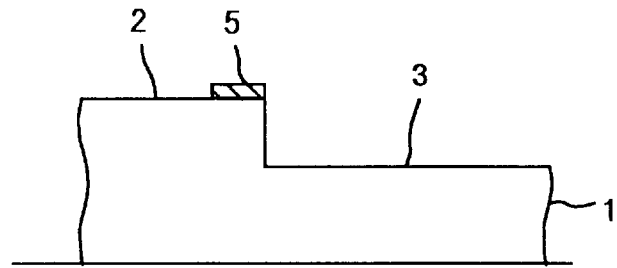
FIGS. 4 and 5 illustrate the manner in which the inventive phase shift mask functions.
Figure 4B:
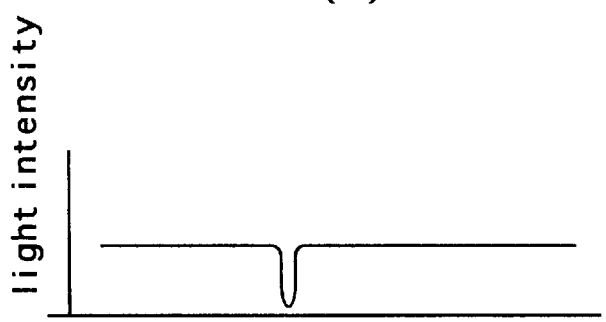

FIGS. 4(a) through 5(b) show states of transmitted light when the light is projected to the above phase shift mask. FIG. 4(a) shows the cross section of opaque-film 5 for forming a dark line of the phase shift mask. The intensity of the light passing through the cross section causes a dark line portion due to opaque-film 5 as shown in FIG. 4(b). FIG. 5(a) shows the cross section of the transition domain 4 of a phase shift mask. The intensity of the light passing through the cross section does not cause any dark line portion as shown in FIG. 5(b).

FIG. 6 is a pattern of transmitted light obtained by the phase shift mask 100 shown in FIGS. 1 to 3. In this case, only a dark line 6 is formed by the opaque mask 5. Broken line 7 shows the position of an unnecessary dark line formed by a conventional phase shift mask. In the case of a phase shift mask of the present invention, however, the dark line is not formed.

Figure 7:
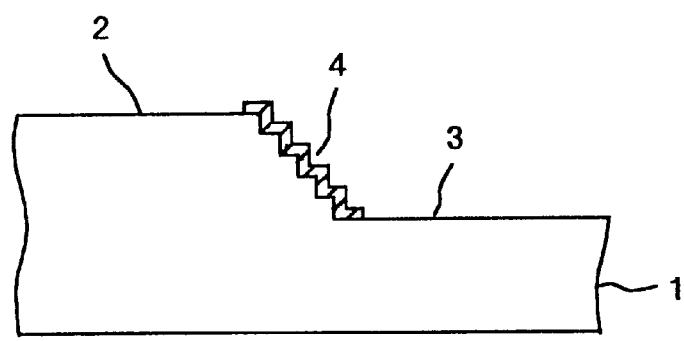
FIG. 7 illustrates a modification of the phase shift mask.

FIG. 7 shows a modification of an opaque-film 5. In the modification, first the transition portion 4 is formed on the entire boundary between the reference plane 2 and the phase shift plane 3. Thereafter, opaque-film 5 is formed on a part of the boundary portion. From the viewpoint of the shading function, the above and other modifications are possible as long as a necessary planar shape of the opaque-film 5 is maintained.

Embodiment 2

Figure 8:
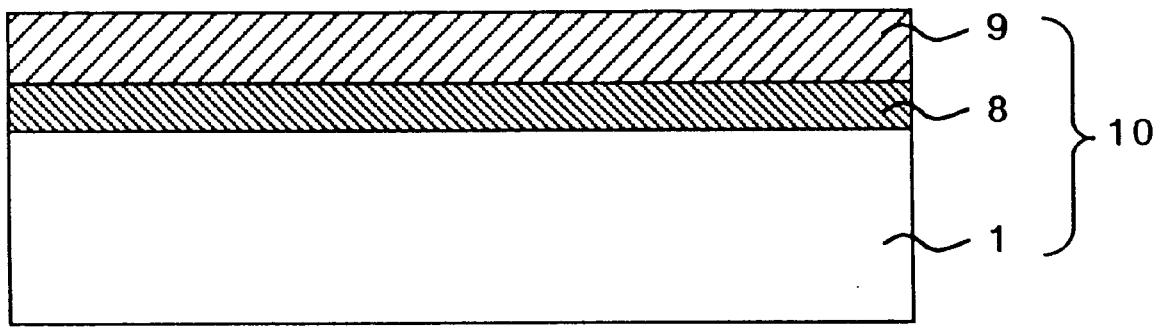
FIGS. 8 to 12 show the steps of manufacturing a phase shift mask according to one embodiment of the present invention.

FIGS. 8 to 12 show the steps of manufacturing a phase shift mask for i-line exposure in accordance with an embodiment of the present invention. First, as shown in FIG. 8, a photomask blank 10 is prepared which includes a quartz substrate 1, a conductive chromium (Cr) film 8 formed on the quartz substrate 1 as an opaque-film, and an electron-beam (EB) resist film 9 formed on the chromium film 8. Then, with reference to FIG. 9, EB resist film 9 is patterned for photomask blank 10 as shown in FIG. 8. The electron beam lithography technique is used to pattern EB resist 9, removing a portion of EB resist film 9 corresponding to a domain A, from which Cr film 8 is to be removed by etching. Then, Cr film 8 is etched by using EB resist film 9 as a mask, and thereafter, the EB resist film 9 is removed, and the Cr film pattern 8 is inspected and amended.

Figure 9:
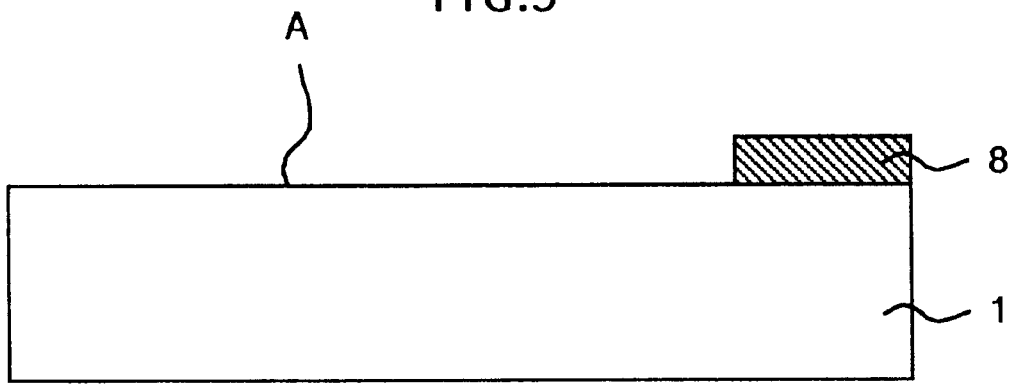
Figure 10:
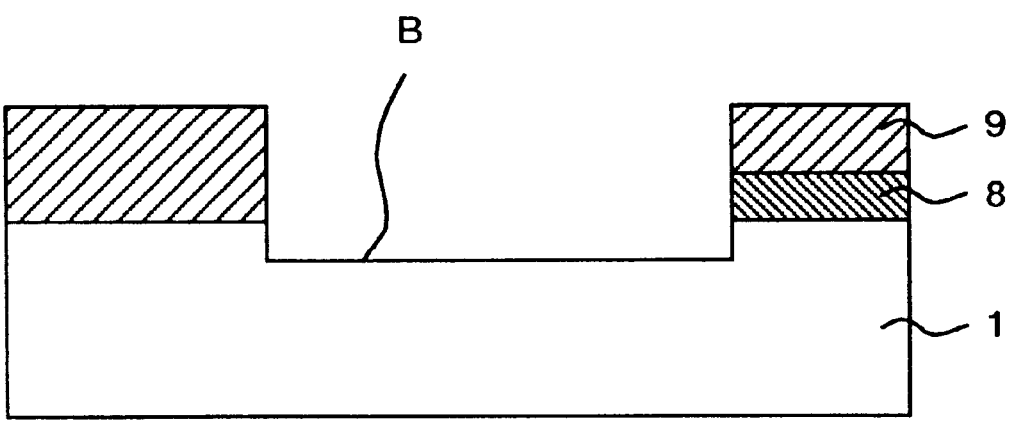

Then, with reference to FIG. 10, another EB resist film 9 is applied to the whole surface of the intermediate mask as shown in FIG. 9. Next, EB writing is performed so as to remove the portion of the EB resist film 9 corresponding to a domain B to be etched by the first etching of the quartz substrate 1. Then, the substrate quartz 1 is dry-etched up to a depth of 270 p by means of reactive ion etching (RIE) using CHF3/CO/Ar gas, and then the EB resist film 9 is removed.

Figure 11:
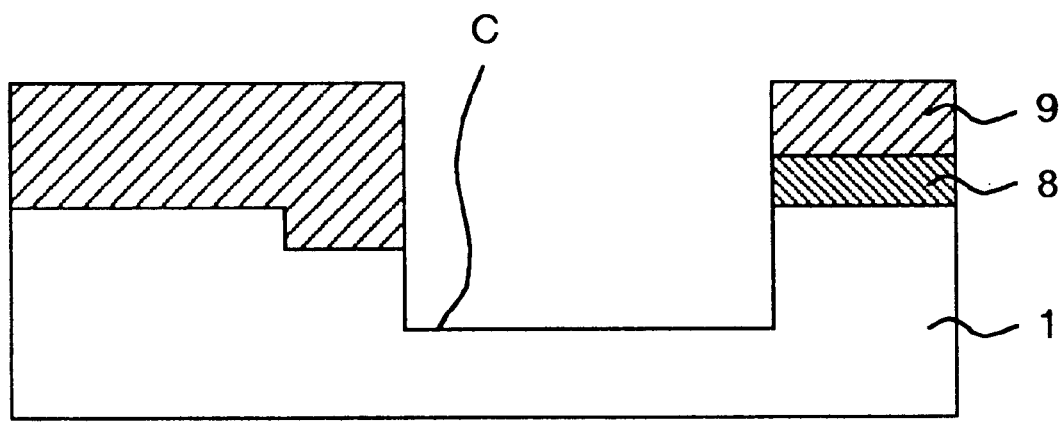

Next, with reference to FIG. 11, another EB resist film 9 is applied to the whole surface of the intermediate mask shown in FIG. 10, and the mask pattern is formed through EB writing corresponding to a domain C, where a second etching of the quartz substrate 1 is applied. The quartz substrate 1 is etched up to a depth of 540 p. Further, similar steps are executed for a third etching to etch the substrate quartz 1 by a depth of 1,081 p Furthermore, similar steps are executed for a fourth etching, to etch the substrate quartz 1 by a depth of 2,163 p. (Here, an etching depth is slightly adjusted so as to set the maximum etching depth to 4,325 p according to the wavelength of transmitted light.)

For example, the portion etched by the fourth etching is at a depth of approximately 4,325 p. It serves as a shifter having a phase difference of 180 p for an i-line (365 nm) transmitted light with reference to the Cr aperture, which has not been etched.

Figure 12:
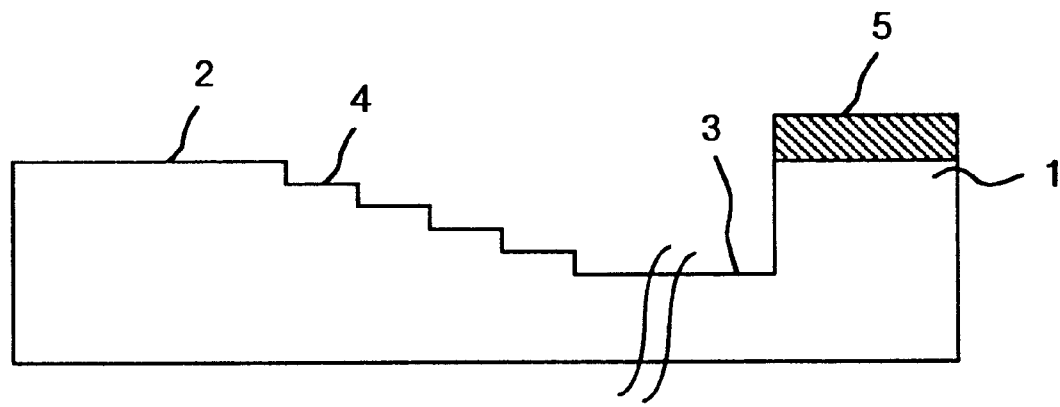

Thus, by etching quartz substrate 1 four times through resist patterning, it is possible to form a phase shift mask whose transition portion 4 has 16 (that is, 24) phase gradations including a portion not etched. FIG. 12 shows a cross section of the phase shift mask thus formed. As shown in the drawing, the phase shift mask 100 is manufactured including the transition portion 4 between the non-phase-shift domain 2 and the phase shift domain 3. Phase shift mask 100 operates so as to stepwise modulate an optical path length in a light transmitting direction by planes perpendicular to the light transmitting direction. This manufacturing method makes it possible to obtain the phase shift mask 100 having a multiple-stage structure which is a feature of the manufacturing method of the present invention.

The above-described method for manufacturing the phase shift mask of this embodiment can be summarized as follows. That is, a photomask blank provided with a transparent substrate and an opaque thin film formed on a principal plane of the transparent substrate is prepared as a material. Then, the opaque thin film is etched to form a necessary opaque-film pattern. Then, part of the transparent substrate at a predetermined domain (phase shift domain) in an aperture of the opaque thin film is etched at least n times (n is a natural number equal to or more than 2). The etching mask patterns and etching depths during n times of the etching step are different from each other, and the transparent substrate is etched n times so as to have up to 2" types of etching depths.

In the example shown in FIGS. 8 to 12, the portion serving as an opaque-film pattern 5 in a finished phase shift mask 10 is first formed and left as it is. However, it is also possible to form an opaque-film pattern 5 in the final step after etching of the quartz substrate 1 is completed. FIG. 7 shows a quartz substrate 1 on which a phase shift domain 3 and a transition domain 4 are formed first, and thereafter, an opaque-film pattern 5 is formed in a part of the transition domain 4.

Embodiment 3

Figure 13:
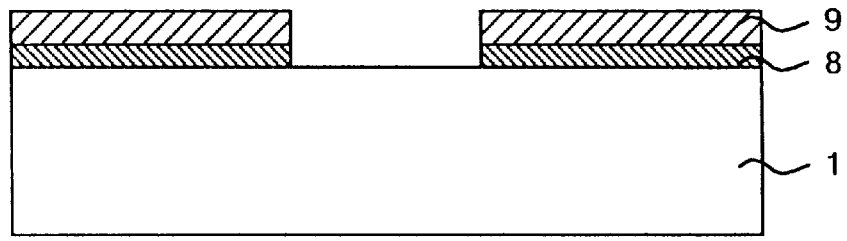
FIGS. 13 to 16 show a method for manufacturing a phase shift mask according to another embodiment of the present invention.

FIGS. 13 to 16 show a method for manufacturing a phase shift mask in accordance with another embodiment of the present invention. First, as shown in FIG. 13, a chromium (Cr) film 8 used as an etching mask for a quartz substrate 1 is formed on the quartz substrate 1. Thus, a film having opaqueness and conductivity is used as an etching mask 8 in this embodiment. Then, an electron-beam (EB) resist film 9 is formed on the film 8.

Then, EB resist film 9 is patterned by the electron-beam lithography technique, removing the portion of EB resist film 9 corresponding to a domain A from which Cr film 8 is to be removed through etching. Then, the Cr film 8 is etched by using the EB resist film 9 as a mask. Then, the EB resist film 9 is removed, and any defects of the patterned chromium film 8 are checked and amended.

Figure 14:
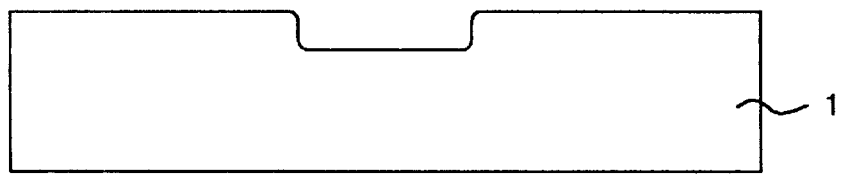

Then, as shown in FIG. 14, the quartz substrate 1 is wet-etched through the chromium pattern 8 as an etching mask up to a predetermined depth. Thereafter, the chromium film 8 is removed.

Figure 15:
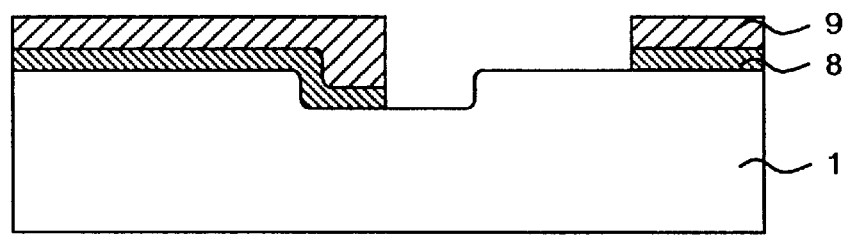

Then, with reference to FIG. 15, another chromium film 8 is formed on the whole surface of the quartz substrate 1 again. Then, another EB resist film 9 is formed on the film 8. Then, the EB resist film 9 is patterned by electron-beam lithography, removing the portion of the EB resist film 9 corresponding to a domain B from which the Cr film 8 is to be removed through etching. Then, the Cr film 8 is etched by using the EB resist pattern 9 as an etching mask. Then, EB resist film 9 is removed, and any defect of the patterned chromium film 8 is checked and amended if necessary.

Figure 16:
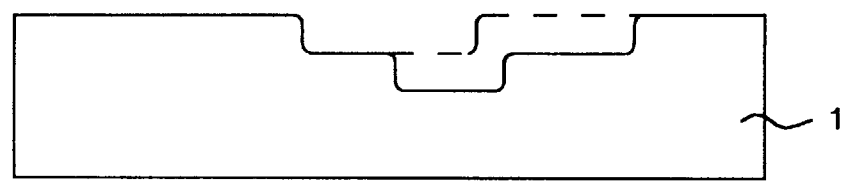
Figures 19A, 19B:
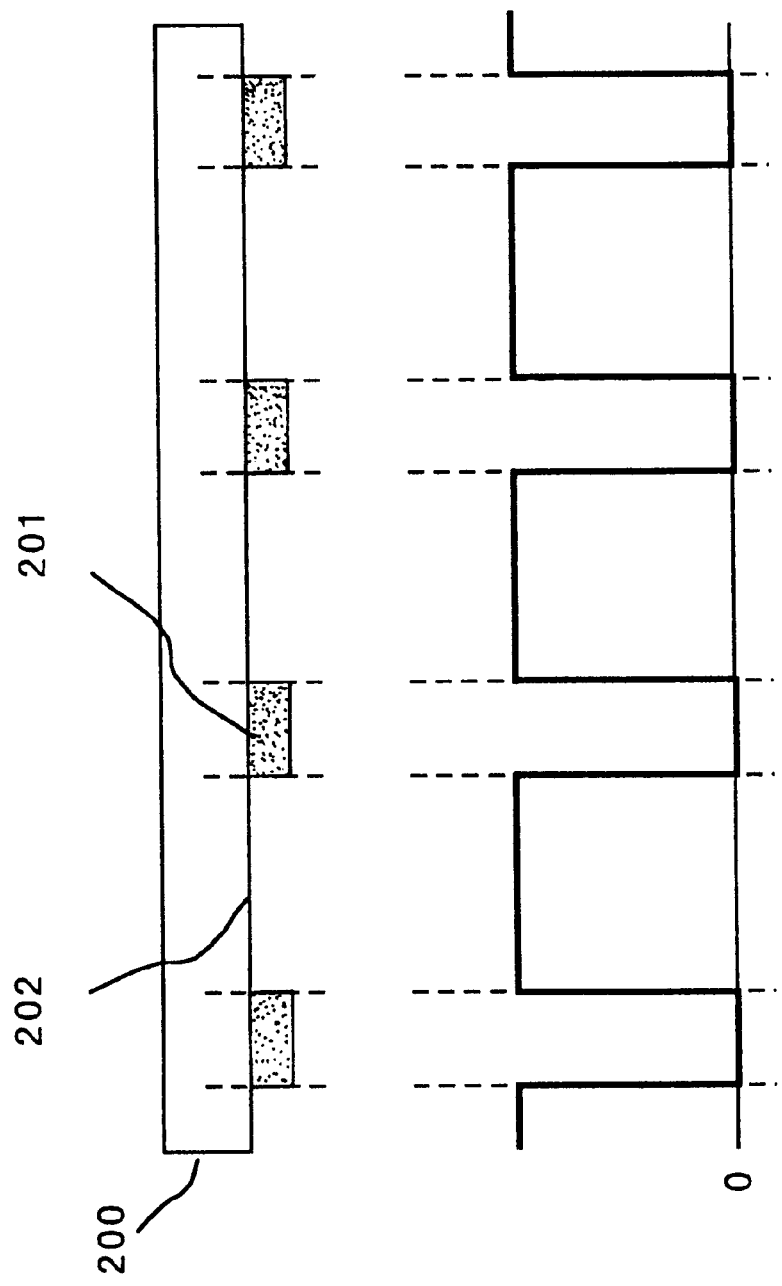
FIG. 19(a) illustrates a sectional view of a conventional photomask.
FIG. 19(b) shows an electric field amplitude immediately after the photomask shown in FIG. 19(a).
Figures 21A, 21B:
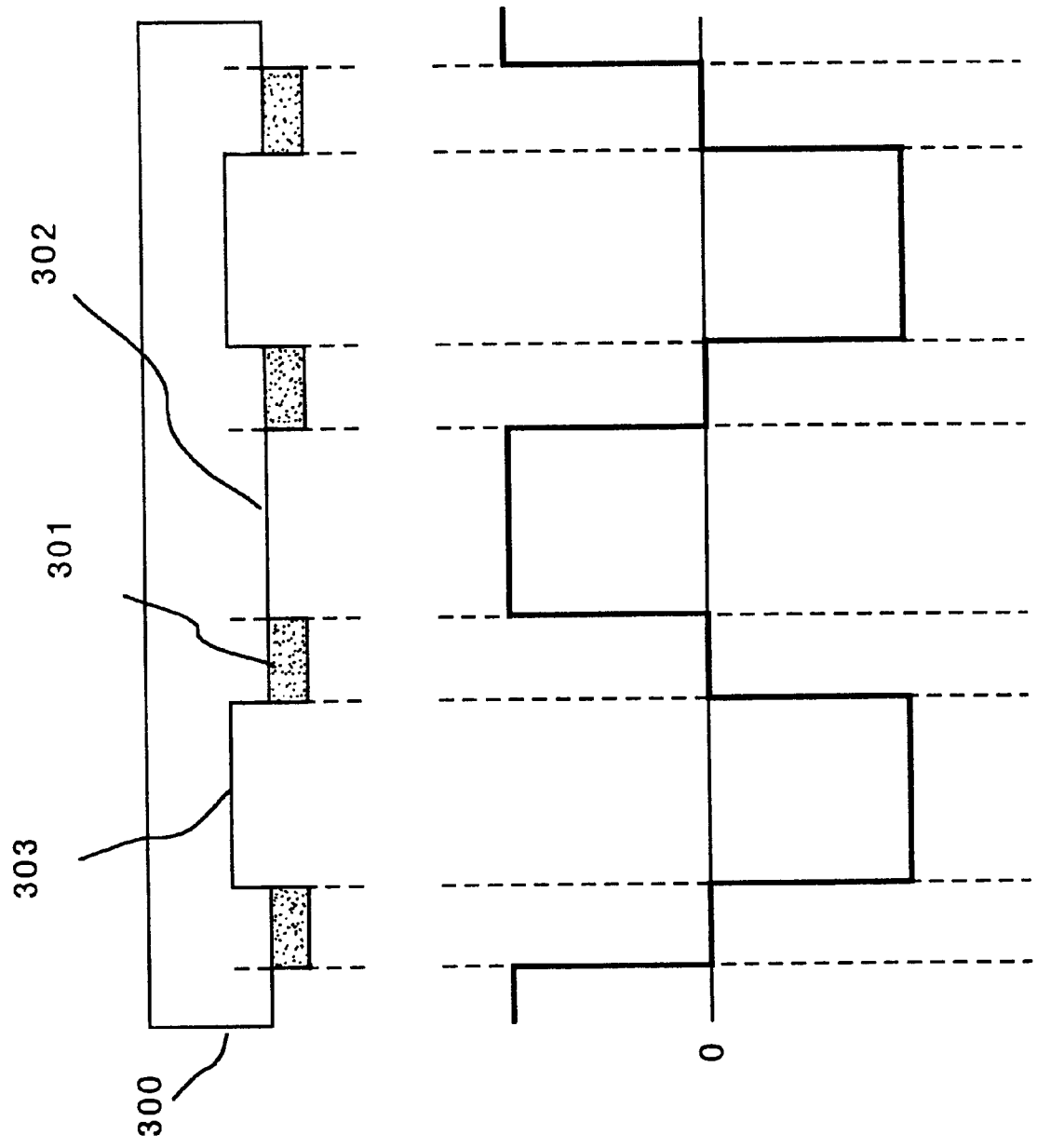
FIG. 21(a) illustrates a sectional view of a Levenson phase shift mask.
FIG. 21(b) shows an electric field amplitude immediately after the Levenson phase shift mask shown in FIG. 21(a).
Figures 22A, 22B:
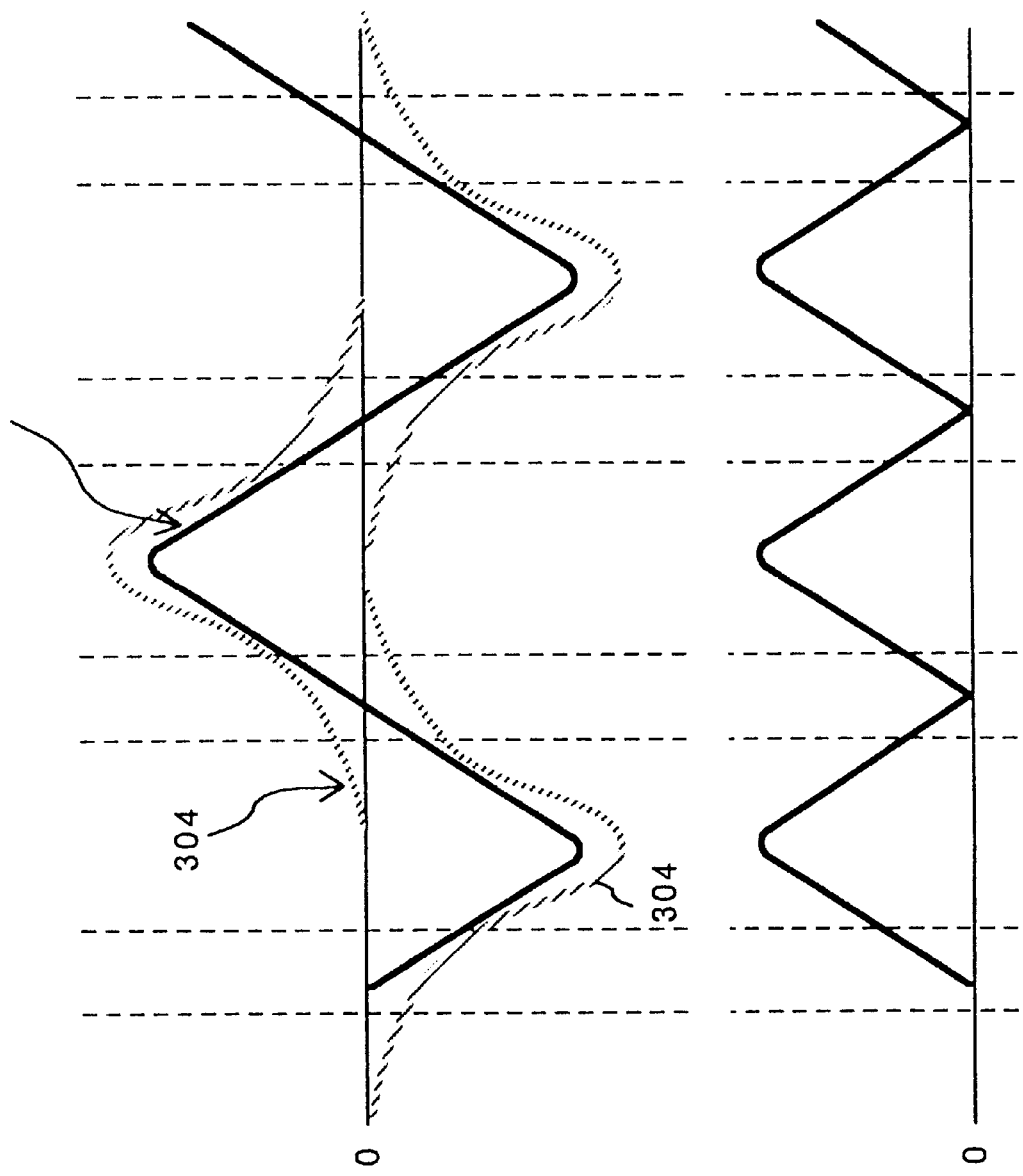
FIG. 22(a) shows an electric field amplitude on a wafer by the Levenson phase shift mask shown in FIG. 21(a).
FIG. 22(b) shows electric field intensity on a wafer by the Levenson phase shift mask shown in FIG. 21(a).
Figure 23:
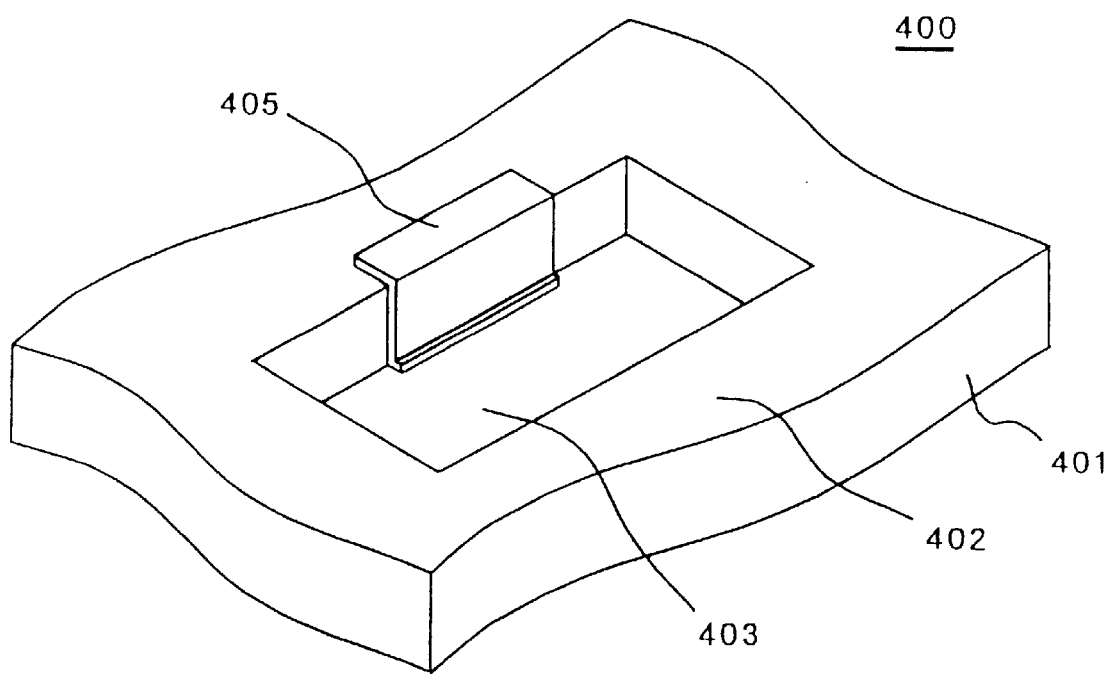
FIG. 23 is a perspective view of a conventional phase shift mask.
Figure 24:
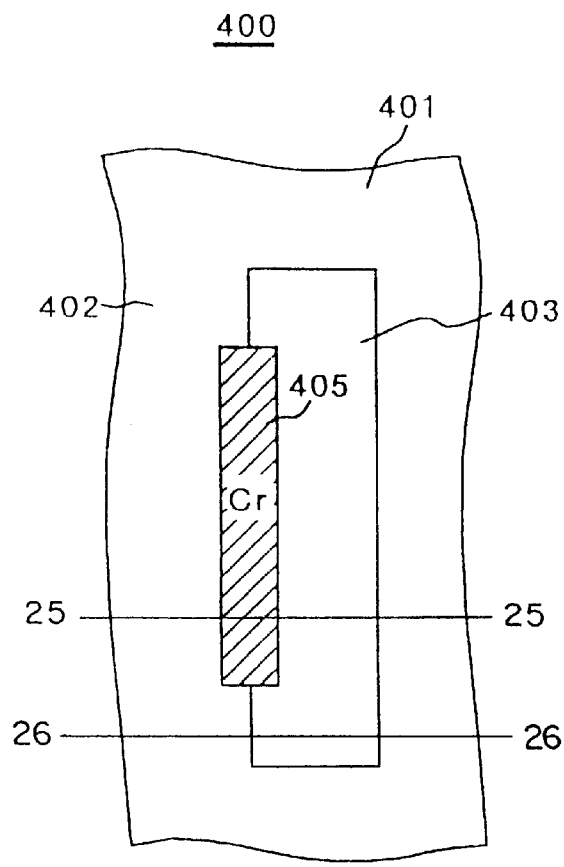
FIG. 24 is a top view of the phase shift mask shown in FIG. 23.
Figure 25:
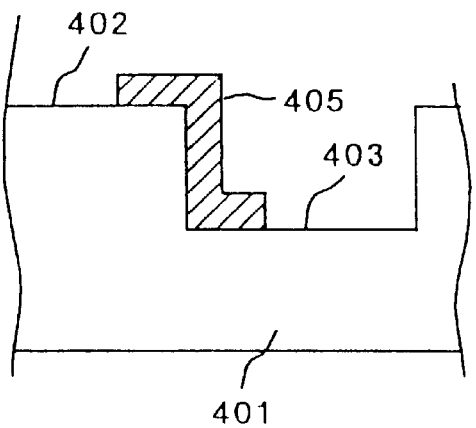
FIG. 25 is a sectional view of the phase shift mask taken along the line A—A in FIG. 24.
Figure 26:
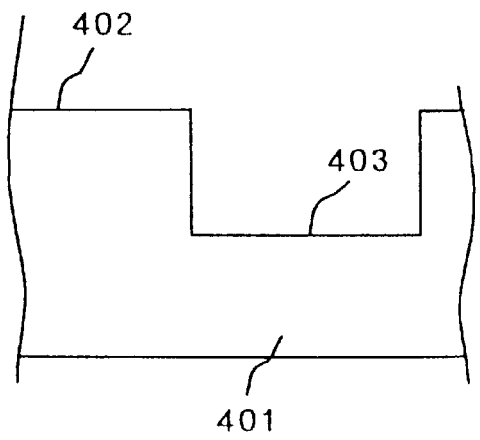
FIG. 26 is a sectional view of the phase shift mask taken along the line B—B in FIG. 24.
Figure 27A:
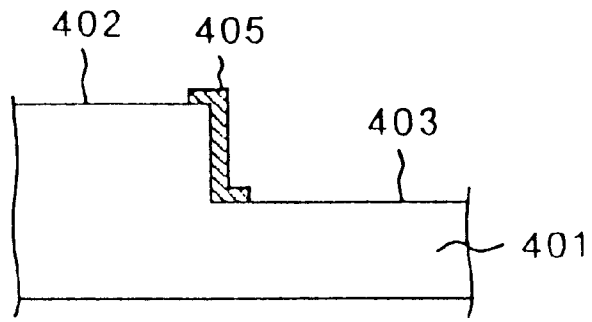
FIG. 27(a) shows a partial cross section of the Levenson phase shift mask for forming a dark line.
Figure 27B:
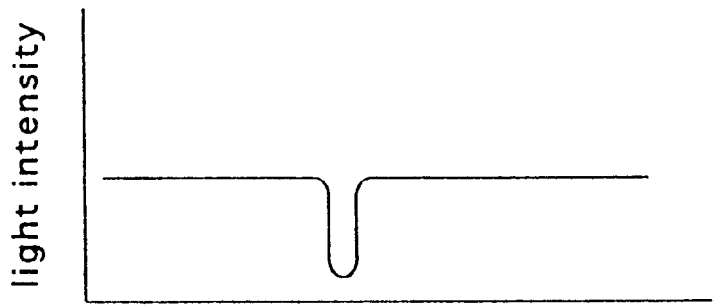
FIG. 27(b) shows the intensity of the light passed through the Levenson phase shift mask shown in FIG. 27(a).
Figure 28A:
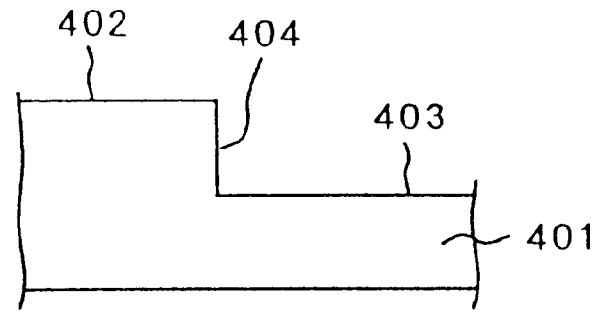
FIG. 28(a) shows a partial cross section of the Levenson phase shift mask.
Figure 28B:
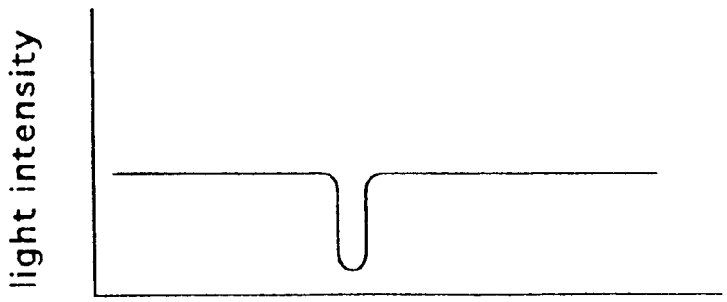
FIG. 28(b) shows the intensity of the light passed through the Levenson phase shift mask shown in FIG. 28(a).
Figure 29:
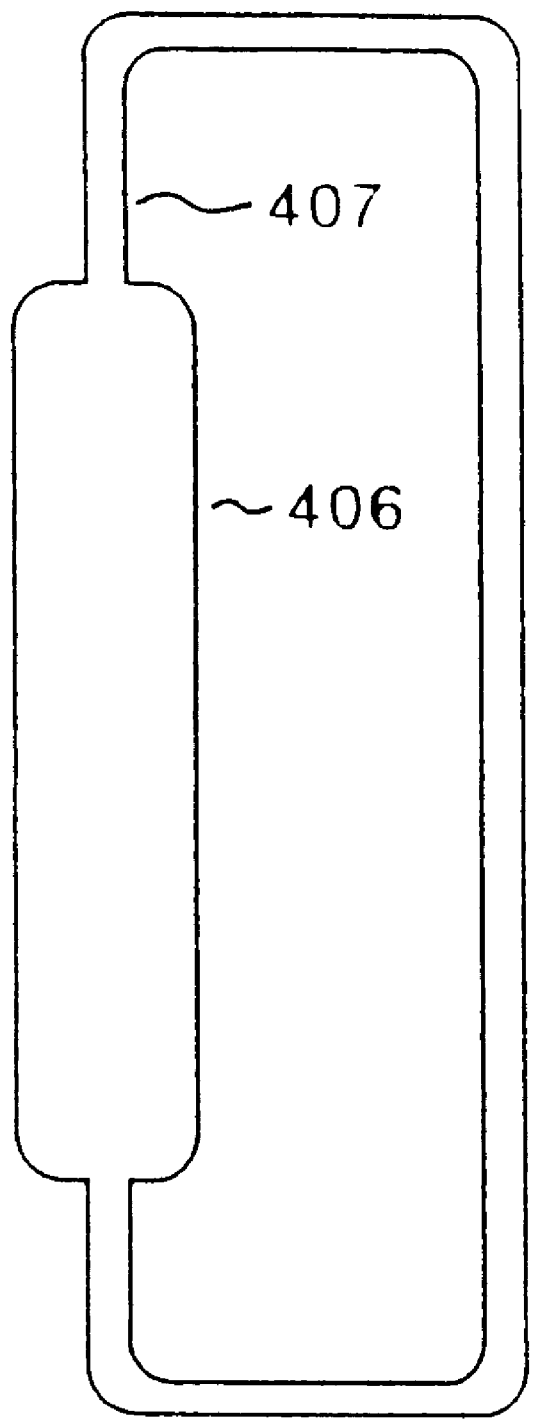
FIG. 29 shows a resist pattern formed on a positive resist on a wafer by a conventional Levenson phase shift mask.

Then, with reference to FIG. 16, the domain B of the quartz substrate 1 is wet-etched up to a predetermined depth through the chromium pattern 8. Thereafter, the chromium film 8 is removed.

The above etching step is repeated to a predetermined domain on the quartz substrate, and thus a phase shift mask is formed.

As described already, a material having conductivity and opaqueness is used as a mask 8 for etching quartz substrate 1. Conductivity is required to prevent an electron beam resist from being electrified when the resist is exposed to an electron beam to form a pattern. opaqueness is required to check if a defect such as a pinhole is formed on the patterned mask by exposing light. A material suitable for the above requirement and for an etching mask is silicon doped with impurities other than chromium.

Further, hydrofluoric acid is used for wet etching.

Repetitive steps of the manufacturing method are summarized as follows. First, a chromium film 8 (mask for etching quartz) is formed on a quartz substrate 1, and an electron-beam (EB) resist film 9 is formed on the chromium film 8. Then, the EB resist film 9 is exposed to an electron beam and is developed to form a pattern. Then, the chromium film 8 is etched and patterned through the pattern of EB resist film 9. Thereafter, the EB resist film 9 is removed, and the chromium film pattern 8 is inspected and any defect is amended. Thereafter, the quartz substrate 1 is etched by using the chromium film pattern 8 as a mask. Then, chromium film pattern 8 is removed. These steps are repeated.

Here, the opaque-film pattern 5 of the phase shift mask 100 is formed in two ways. First, the opaque-film pattern 5 may be formed before starting the etching of quartz substrate 1. Second, the opaque-film pattern 5 may be formed after completing the etching of quartz substrate 1. FIG. 7 shows a phase shift mask in which an opaque-film pattern 5 is formed in part of the transition domain 4, after forming a phase shift domain 3 and transition domain 4 on a quartz substrate 1

In the above-described embodiment of a method for manufacturing the phase shift mask, the etching of a transparent substrate is performed at least n times (n is a natural number equal to or more than 2). The etching mask patterns and etching depths in the n times of the etching are different from each other, and the transparent substrate is etched so as to have up to $2^n$ types of etching depths. Thereafter, an opaque thin film is formed on the transparent substrate and patterned. Alternatively, an opaque thin film is formed beforehand prior to the repetitive etching of the transparent substrate.

In this method, etching is performed by wet etching in each of the n times etching of the transparent substrate, and the etching mask has corrosion resistance against chemical solutions used for n times of wet etching. Further, the etching mask is made of a material having conductivity and opaqueness.

Further, the etching mask used for the above wet etching is preferably made of a thin film of amorphous silicon doped with phosphorus or boron, and the chemical solution used for the wet etching contains preferably at least hydrogen fluoride.

Embodiment 4

FIGS. 17(a) to 18(c) are illustrations for explaining a method for manufacturing a phase shift mask of still another embodiment of the present invention. These illustrations are top views and sectional views showing the concept of an arrangement of an etching mask pattern for forming a smooth transition portion. The smooth transition portion is at the boundary portion between a phase shift domain and a non-phase-shift domain in a phase shift mask and the structure of the transition portion of a phase shift mask formed by the etching mask. FIG. 17(a) is a top view of quartz substrate 1, FIG. 17(b) is a partial top view of a plurality of etching masks 11 to 13, and FIG. 17(c) is an illustration showing the relation between etching masks 11 to 13 and binary numbers. Further, FIG. 18(a) is a sectional view of the quartz substrate 1 and shows A—A cross section in FIG. 17(a). FIG. 18(b) is a sectional view of a plurality of etching masks 11 to 13, which corresponds to the etching masks in FIG. 17(b). FIG. 18(c) is an illustration showing the relation between etching masks 11 to 13 and binary numbers.

An etching process is described below by referring to FIGS. 17(a) to 18(c). To begin with, the etching mask 11 shown in FIGS. 17(b) and 18(b) is used for the first-time etching of quartz substrate 1 serving as a phase shift mask. In this mask, aperture portion 11a and non-aperture portion 11b are arranged alternately, or in stripe fashion, at a width of one time (that is, $2^0$ time) the width of a step of the transition portion of a phase shift mask. The first-time etching depth is set to one time (that is, $2^0$ time) the height (level difference) of one step of the staircase of the phase shift mask.

Then, the etching mask 12 in FIGS. 17(b) and 18(b) is used for the second-time etching of the quartz substrate 1. In this mask, etching aperture portion 12a and non-aperture portion 12b are alternately arranged at a width two times (that is, $2^1$ times) larger than the width of the staircase of the transition portion of a phase shift mask. The second-time etching depth is set to two times (that is $2^1$ times) the height (level difference) of one step of the staircase of a phase shift mask.

Then, the etching mask 13 shown in FIGS. 17(b) and 18(b) is used for the third-time etching of the quartz substrate 1. In this mask, etching aperture portion 13a and non-aperture portion 13b are alternately arranged at a width four times (that is, $2^2$ times) larger than the width of the staircase of the transition portion of a phase shift mask. The third-time etching depth is set to four times (that is, $2^2$ times) the height (level difference) of one step of the staircase of the transition portion of a phase shift mask.

By repeating the etching of quartz substrate 1 three times in the above manner, a smooth stepwise transition portion 4 is obtained having eight steps (that is, $2^3$ steps) as shown by the sectional view of FIG. 18(a). That is, a multiple-stage phase shift mask is formed in which an optical path length in a light transmitting direction has a multiple-stage modulated gradation by planes perpendicular to the light transmitting direction.

The above is generalized as follows. That is, an etching mask is formed so that an aperture portion and a non-aperture portion are arranged like stripes at a width $2^{(n-1)}$ times ($W \times 2^{n-1}$ times) larger than the staircase width (to be assumed as W) of the transition portion of a phase shift mask to be completed. Here, n is an integer starting with 1, forming an etching mask for each integer. The value of n is determined by the number of stages of the staircase a phase shift mask needs to be completed. There can be up to $2^n$ number of stages.

Next, an etching depth is considered below. The etching depth is made to be $2^{(n-1)}$ times ($H \times 2^{n-1}$ times) of the level difference (to be assumed as H) of the staircase of the transition portion of a phase shift mask to be completed. Here, an integer n is made to coincide with an integer n for the above etching mask.

Thus, a multiple-stage phase shift mask is manufactured in which the transition portion has $2^n$ phase gradations through n times of etching. For example, a phase shift mask having phases of eight gradations can be obtained through etching only three times according to the present method, as opposed to etching seven times in the conventional method.

For the above etching of the n-th time with $2^{n-1}$ times of unit depth, it is effective to use the etching mask with integer n starting from 1 and sequentially increasing. However, the sequence of etching is not restricted to the above mentioned order. Etching in different sequences also results in the same phase shift mask theoretically, although each end of the masks should be aligned.

Then, the above etching is considered further in accordance with the binary numbers shown in FIGS. 17(c) and 18(c). The binary numbers in FIGS. 17(c) and 18(c) correspond to a staircase step of transition portion 4 with etching depth starting from the smaller side to the larger side. Each of the binary numbers corresponds to the etching depth of a corresponding staircase step. Further, a staircase step with a binary number having a value 1 at the first digit indicates that it is etched at the first-time etching. Further, a staircase step with a binary number having a value 1 at the second digit indicates that it is etched at the second-time etching. Similarly, a staircase step with a binary number having a value 1 at the third digit indicates that it is etched at the third-time etching.

In other words, an increasing binary number is set corresponding to each staircase step width of the transition portion of a phase shift mask to be completed from a smaller etching depth side to a larger etching depth side. When the binary number has a value 1 at the nth digit, an etching mask in which the portion of value 1 is opened is used, and etching is performed to the depth of $2^{(n-)}$ times of a unit level difference of the staircase steps. By applying the etching similarly for each digit of the binary numbers, a phase shift mask with etching depths increasing in order is formed.

The width and the level difference of the staircase steps of a phase shift mask are determined by the wavelength of light used, or by a pattern of the line formed by the phase shift mask.

The phase shift mask first described, and shown in FIGS. 1 to 3, is a multiple-stage phase shift mask obtained by the above-mentioned manufacturing method. A phase shift mask having a transition portion finely shifting stepwise from 0 p to 180 p is formed according to this manufacturing method. In this method, a sudden change from 0 p to 180 p phase shift does not occur as in a conventional two-phase mask, and an unneeded dark pattern resulting from such sudden change is not formed. Therefore, it is possible to form an isolated line using a positive resist.

The above is further described below by referring to the drawings. When a fine line pattern is formed by the phase shift mask of the present invention, as shown in FIGS. 1 to 3, only a pattern 6 of a necessary line is formed as shown in FIG. 6. A pattern 7 of an unnecessary line, which has been formed in the conventional method, is eliminated, and therefore, any substantial problem for practical use does not occur.

To realize a phase shift mask as mentioned above, the conventional method requires etching seven times for manufacturing a phase shift mask of eight gradations. However, the present method requires etching only three times for manufacturing. Therefore, the process can greatly be shortened.

The above-described method for manufacturing a phase shift mask of the present invention can be summarized as follows. That is, in the case of the present invention, etching of a transparent substrate is performed n times (n is a natural number equal to or more than 2), and etching mask patterns and etching depths are different from each other in the above n times of etching, and further the transparent substrate is etched so as to have up to $2^n$ kinds of etching depths through n times of etching. This is already described above. In addition, in the invention, the etching depth at an optional time of etching in the above n times of etching is set to any one of $2^{(m-1)}$ times of a unit depth, assuming m as a natural number equal to or less than n.

Further, the etching depth at the mth-time etching, in the above n times of etching, is preferably set to $2^{(m-1)}$ times of the unit depth, assuming m as a natural number equal to or less than n.

Furthermore, in the invention, the etching mask pattern at an optional time of etching in the above n times of etching includes a rectangle pattern, and the minor width of the rectangle is set to any one of $2^{(m-1)}$ times of a unit width, assuming m as a natural number equal to or less than n.

Furthermore, in the invention, the etching mask pattern at the mth-time etching in the above n times of etching includes a rectangle pattern, and the minor width of the rectangle is set to $2^{(m-1)}$ times of a unit width, assuming m as a natural number equal to or less than n.

As described above, the present invention makes it possible to efficiently manufacture a multiple-stage phase shift mask while etching a fewer number of times.

The phase shift mask of the present invention enjoys utility during various stages in manufacturing a semiconductor device wherein photolithographic techniques are employed.

For example, conventional photolithographic processing comprises forming a layer of photoresist material on a semiconductor substrate to form a pattern through which etching of an underlying layer is conducted, e.g., conductive or insulating material.

Figure 30:
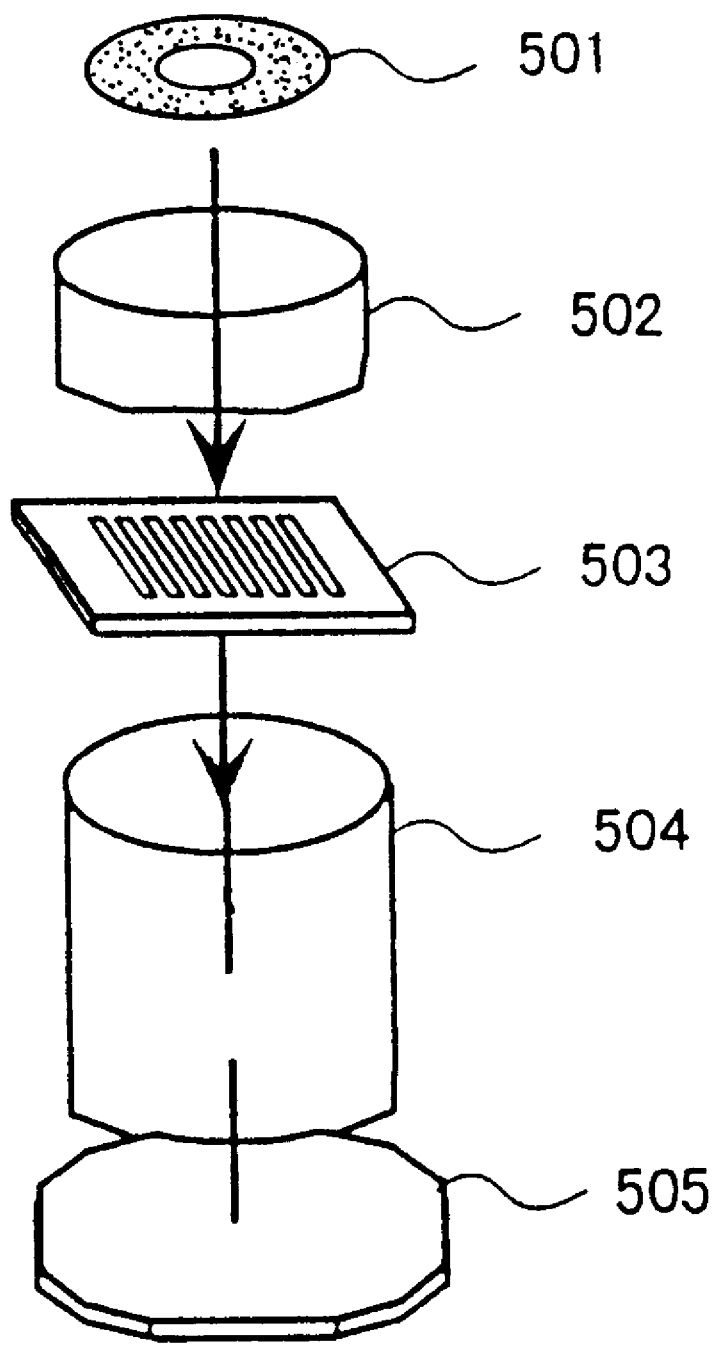
FIG. 30 shows a exposure method of a mask to a reseit film on a semiconductor wafer.

An exposure method employed in photolithography will be explained with reference to FIG. 30. Exposure light emitted by a light source 501 travels through a condenser lens 502 and falls on a mask 503 such as phase shift mask according to the present invention. The exposure light transmitted through the mask 503 travels through a demagnification projection lens system 504. An image of the mask 503 is formed by the projection lens system 504 at a predetermined demagnification on a photoresist film on a semiconductor wafer 506.

The photoresist layer employed in the present invention can comprise any photoresist material typically employed in conventional semiconductor manufacturing processes including positive and negative working photoresist materials.

Figure 31:
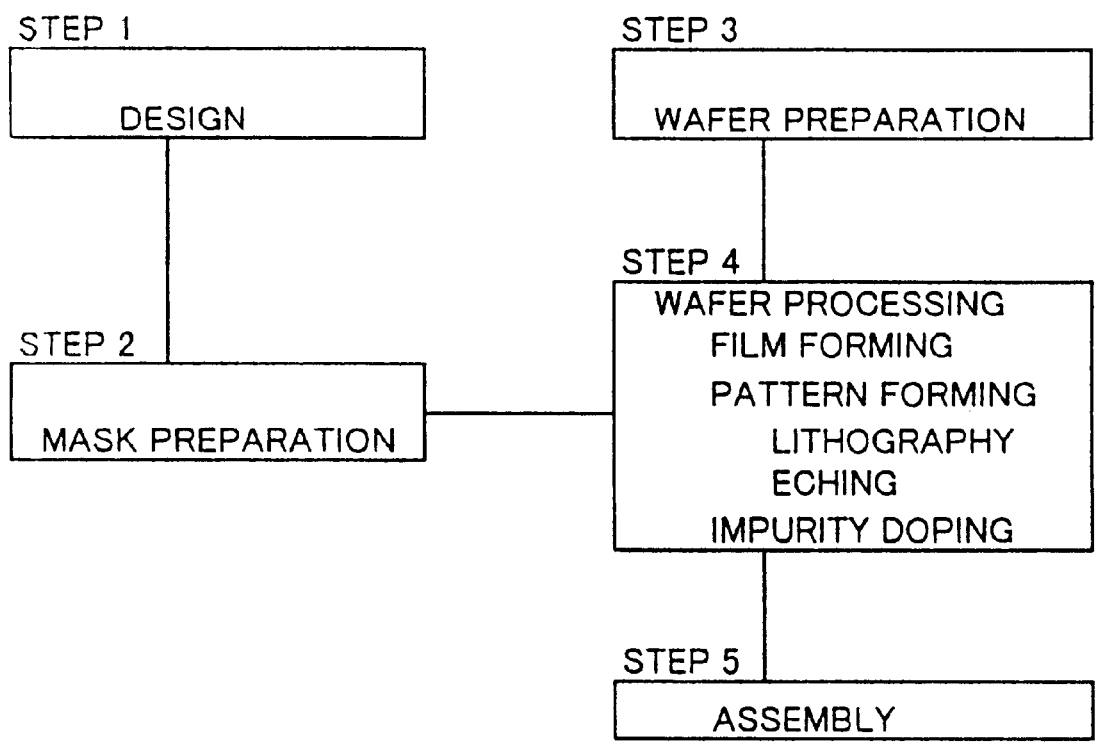
FIG. 31 shows a process for manufacturing a semiconductor device.

FIG. 31 shows a principal process of manufacturing a semiconductor device. As shown in FIG. 31, designing of a device and masks is performed in a step 1, followed by preperation of masks in a step 2. The phase shift masks according to the present invention are also prepared. On the other hand, semiconductor wafers are prepared in a step 3. Then, the wafers are processed to form a designed structure in a step 4 through film forming, pattern forming, immpurity doping, etc. A pattern on a photo resit film on a wafer is formed by photolithograpy technique using a photomask including a phase shift mask according to the present invention. Then, the wafer is subjected to etching. Semiconductor chips obtained through these process are assembled in a step 5, and semicondeuctor devices are produced.

Thus, for example, an embodiment of the present invention is a method of manufacturing a semiconductor device, which method comprises: forming a phase shift mask comprising: a phase-shift domain, a non-phase-shift domain, a stepwise transition domain between the phase-shift domain and the non-phase-shift domain, and an opaque thin-film pattern at a predetermined portion between the phase-shift domain and the non-phase-shift domain; depositing a layer of photoresist material on a semiconductor substrate; and transferring a pattern from the phase shift mask to the photoresist layer by photolithography.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a phase shift mask, which method comprises:

forming an opaque thin-film pattern at a predetermined portion of the boundary between a phase-shift domain and a non-phase-shift domain;

forming a transition portion at said boundary portion to which said opaque thin-film pattern is not applied;

selecting an etching depth having stepwise changes up to $2^n$ steps, wherein n is an integer greater than 2; and performing n etching steps at different etching depths using n different etching mask patterns.

2. The method according to claim 1, comprising:

forming an opaque thin-film on a transparent substrate;

patterning said opaque thin-film; and forming said phase shift domain and said transition portion subsequent to performing the step of patterning.

3. The method according to claim 1, comprising forming said phase shift domain and said transition portion, and thereafter forming said opaque-film pattern.

4. The method according to claim 1, comprising:

forming said etching mask of a material having prescribed opaqueness and conductivity; applying an electron beam resist thereon; and patterning by exposing the electron beam resist to an electron beam.

5. The method according to claim 1, comprising wet-etching said transparent substrate, wherein said etching mask is made of a material having corrosion resistance against a chemical solution used for said wet etching.

6. The method according to claim 5, comprising wet-etching with a chemical solution containing hydrogen fluoride, wherein said etching mask is formed with an amorphous silicon thin film doped with phosphorus or boron.

7. The method according to claim 1, where in said etching mask pattern is formed with a resist for dry-etching said transparent substrate.

8. The method according to claim 1, wherein the etching depth at an optional time of etching, in said n times of etching, is up to $2^{(m-1)}$ times the unit depth, and wherein m is an integer equal to or less than n.

9. The method according to claim 8, wherein the etching depth at the mth-time etching, in said n times of etching, is $2^{(m-1)}$ times the unit depth, wherein m is an integer equal to or less than n.

10. The method according to claim 1, wherein the etching mask pattern at an optional time of etching, in said n times of etching, includes a rectangle, and the width of said rectangle is up to $2^{(m-1)}$ times of the unit width, wherein m is an integer equal to or less than n.

11. The method according to claim 10, wherein the etching mask pattern at the mth-time etching, in said n times of etching, includes a rectangle, and the width of said long rectangle is $2^{(m-1)}$ times of the unit width, wherein m is an integer equal to or less than n.

12. A method of manufacturing a semiconductor device, which method comprises:

transferring a pattern from a phase shift mask formed by the method as defined in any one of claim 1 to 11 to a photoresist layer by photolithography.

13. A semiconductor device comprising:

a pattern from a phase-shift mask, wherein said phase-shift mask is formed by the method as defined in any one of claims 1 to 11.

14. A phase shift mask manufactured by the manufacturing method according to claim 1.

* * * * *